United States Patent
Ijiri et al.

(10) Patent No.: US 8,227,826 B2
(45) Date of Patent: Jul. 24, 2012

(54) METHOD OF STORING GAN SUBSTRATE, STORED SUBSTRATE, AND SEMICONDUCTOR DEVICE AND METHOD OF ITS MANUFACTURE

(75) Inventors: Hideyuki Ijiri, Itami (JP); Seiji Nakahata, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 12/877,086

(22) Filed: Sep. 7, 2010

(65) Prior Publication Data
US 2010/0326876 A1    Dec. 30, 2010

Related U.S. Application Data

(63) Continuation of application No. 11/762,786, filed on Jun. 14, 2007, now Pat. No. 7,811,908.

(30) Foreign Application Priority Data

Jun. 14, 2006 (JP) ................. 2006-164832

(51) Int. Cl.
- H01L 27/15 (2006.01)
- H01L 29/267 (2006.01)
- H01L 29/22 (2006.01)
- H01L 29/227 (2006.01)
- H01L 33/00 (2010.01)

(52) U.S. Cl. ........... 257/98; 257/81; 257/99; 257/678; 257/684; 257/E21.09; 257/E21.119; 257/E21.126; 257/E21.222

(58) Field of Classification Search ........... 257/E21.09, 257/E21.119, E21.126, E21.222
See application file for complete search history.

(56) References Cited

U.S. PATENT DOCUMENTS

| | | | | |
|---|---|---|---|---|
| 6,527,857 | B1 * | 3/2003 | Pankove | 117/98 |
| 6,875,082 | B2 * | 4/2005 | Nakayama et al. | 451/36 |
| 7,501,299 | B2 * | 3/2009 | Wong et al. | 438/31 |
| 2003/0118746 | A1 * | 6/2003 | Kim | 427/554 |
| 2005/0269577 | A1 * | 12/2005 | Ueda et al. | 257/80 |

(Continued)

FOREIGN PATENT DOCUMENTS

CN    1464543 A   * 12/2003

(Continued)

OTHER PUBLICATIONS

EIAJ, Handling Guidance for Semiconductor Devices, Mar. 1996, Electronic Industries Association of Japan, p. 25.*

*Primary Examiner* — Mohsen Ahmadi
(74) *Attorney, Agent, or Firm* — James W. Judge

(57) ABSTRACT

Affords a method of storing GaN substrates from which semiconductor devices of favorable properties can be manufactured, the stored substrates, and semiconductor devices and methods of manufacturing the semiconductor devices. In the GaN substrate storing method, a GaN substrate (1) is stored in an atmosphere having an oxygen concentration of 18 vol. % or less, and/or a water-vapor concentration of 12 g/m$^3$ or less. Surface roughness Ra of a first principal face on, and roughness Ra of a second principal face on, the GaN substrate stored by the storing method are brought to no more than 20 nm and to no more than 20 μm, respectively. In addition, the GaN substrates are rendered such that the principal faces form an off-axis angle with the (0001) plane of from 0.05° to 2° in the <1$\bar{1}$00> direction, and from 0° to 1° in the <11$\bar{2}$0> direction.

2 Claims, 2 Drawing Sheets

U.S. PATENT DOCUMENTS

| | | | |
|---|---|---|---|
| 2006/0032428 A1* | 2/2006 | Dwilinski et al. | 117/11 |
| 2006/0086948 A1* | 4/2006 | Ohno et al. | 257/103 |
| 2006/0286817 A1* | 12/2006 | Kato et al. | 438/791 |
| 2007/0277731 A1* | 12/2007 | Han | 117/100 |
| 2008/0003440 A1* | 1/2008 | Ijiri et al. | 428/450 |

FOREIGN PATENT DOCUMENTS

| | | |
|---|---|---|
| JP | 2004-349502 A | 12/2004 |
| JP | 2004-356609 A | 12/2004 |
| JP | 2006-0001647 A | 1/2006 |

* cited by examiner

METHOD OF STORING GAN SUBSTRATE, STORED SUBSTRATE, AND SEMICONDUCTOR DEVICE AND METHOD OF ITS MANUFACTURE

BACKGROUND OF THE INVENTION

1. Technical Field

The present invention relates to methods of storing GaN substrates used to manufacture semiconductor devices, GaN substrates stored by the storing methods, semiconductor devices in which an at least single-lamina semiconductor layer is formed on the GaN substrates, and methods of manufacturing such semiconductor.

2. Description of the Related Art

GaN substrates are widely employed in light-emitting diodes (LEDs), laser diodes (LDs) and other semiconductor devices.

In thus employing GaN substrates, the process whereby the substrates are manufactured is ordinarily separate from the process whereby the manufactured GaN substrates are used to produce semiconductor devices, meaning that the manufactured GaN substrates are stored for a fixed time period, and then used to produce the semiconductor devices. Therefore, various methods of housing and storing manufactured GaN substrates have been proposed to date. (For example, cf. Japanese Unexamined Patent App. Pub. No. 2000-355392).

With these conventional GaN substrate-storing methods, however, inasmuch as the GaN substrates are housed and stored under a clean air atmosphere, the surface of the GaN substrates oxidizes due to the prolonged storage, which has been prohibitive of manufacturing semiconductor devices with favorable properties.

BRIEF SUMMARY OF THE INVENTION

The present invention is directed to solving this problem, and an object of the invention is to make available: a method of storing GaN substrates from which semiconductor devices of favorable properties can be manufactured, GaN substrates stored by the storing method, semiconductor devices in which an at least single-lamina semiconductor layer is formed on the GaN substrates, and a method of manufacturing such semiconductor devices.

One aspect of the present invention is a method of storing a GaN substrate under an atmosphere having an oxygen concentration of 18 vol. % or less, and/or a water-vapor concentration of 25 g/m³ or less.

In a GaN substrate storing method involving the present invention, the oxygen concentration can be made 5 vol. % or less, and/or the water-vapor concentration 17 g/m³ or less.

Additionally, in a GaN substrate stored by a storing method involving the present invention, the surface roughness Ra of a first principal face thereof can be made 20 nm or less, while the surface roughness Ra of a second principal face thereof made 20 μm or less. Likewise, the surface roughness Ra of the first principal face can be brought to 5 nm or less, while the surface roughness Ra of the second principal face can be brought to 10 μm or less.

Furthermore, in a GaN substrate storing method involving the present invention, an off-axis angle formed by the GaN substrate principal faces and the (0001) plane can be made between 0.05° and 2°, inclusive, in the <1$\bar{1}$00> direction, and between 0° and 1°, inclusive, in the <11$\bar{2}$0> direction. Likewise, the off-axis angle can be made between 0.1° and 0.8°, inclusive, in the <1$\bar{1}$00> direction, and between 0° and 0.6°, inclusive, in the <11$\bar{2}$0> direction. Herein, "principal faces" means both first principal face and the second principal face.

The present invention in another aspect is a GaN substrate stored by the storing method described above. A further aspect of the present invention is a semiconductor device in which an at least single-lamina semiconductor layer is formed on the first principal face of a GaN substrate stored by the storing method. Yet another aspect of the present invention is a semiconductor device manufacturing method including a step of selecting a GaN substrate stored by the storing method as a base to grow an at least single-lamina semiconductor layer on the GaN substrate first principal face.

The present invention affords a method of storing GaN substrates whereby the manufacture of semiconductor devices of favorable properties is made possible, and affords GaN substrates stored by the storing method, semiconductor devices in which an at least single-lamina semiconductor layer is formed on the GaN substrates, and a method of manufacturing such semiconductor devices.

From the following detailed description in conjunction with the accompanying drawings, the foregoing and other objects, features, aspects and advantages of the present invention will become readily apparent to those skilled in the art.

DETAILED DESCRIPTION OF THE INVENTION

Embodiment Mode 1

A GaN substrate storing method involving the present invention is characterized in that a GaN substrate is stored in an atmosphere having an oxygen concentration of 18 vol. % or less, and/or a water-vapor concentration of 25 g/m³ or less.

Storing the GaN substrate in the atmosphere in which the oxygen concentration is 18 vol. % or less, and/or the water-vapor concentration is 25 g/m³ or less curbs oxidation of the GaN substrate surfaces, making it possible to manufacture a semiconductor device of favorable properties. From this perspective, the oxygen concentration is preferably 5 vol. % or less, and/or the water-vapor concentration 17 g/m³ or less, and more preferably, the oxygen concentration is 1 vol. % or less, and/or the water-vapor concentration is 4 g/m³ or less.

Figure 1:
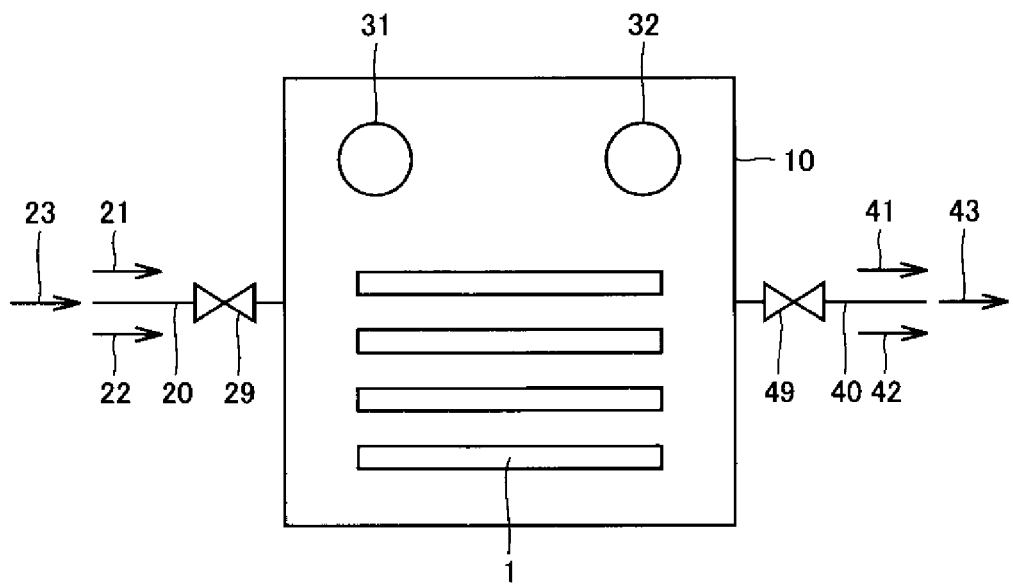
FIG. 1 is a schematic diagram illustrating one embodiment of a GaN substrate storing method involving the present invention.

Herein, the technique whereby in the atmosphere for storing the GaN substrate the oxygen concentration is made 18 vol. % or less, and/or the water-vapor concentration is made 25 g/m³ or less is not particularly limited, wherein a storing device 10 as illustrated in FIG. 1 may for example be employed. The storing device 10 is provided with a gas introduction line 20, a gas introducing valve 29, a gas exhaust line 40, and a gas exhaust valve 41.

Examples of a technique for reducing, in an atmosphere for storing the GaN substrate, the oxygen concentration to no more than 18 vol. % include a technique (referred to as "Technique A-1"—likewise below) whereby, referring to FIG. 1, with GaN substrates 1 placed inside the storing device 10, Gas 21 whose oxygen concentration is 18 vol. % or less is introduced into the storing device 10 via the gas introduction line 20 and the valve 29, and Gas 41 whose oxygen concentration is higher than 18 vol. % is exhausted from the storing device 10 via the gas exhaust line 40 and the valve 49. Oxygen concentration can also be reduced by a technique (referred to as "Technique A-2"—likewise below) whereby together with the GaN substrates 1, an oxygen scavenger 31 is placed inside the storing device 10. Moreover, Technique A-1 and Technique A-2 can be employed in tandem.

Herein, the gas whose oxygen concentration is 18 vol. % or less is not particularly limited, but from the perspective of not causing chemical reactions with the surface of the GaN substrates, a nitrogen gas, argon gas, or other inert gas in which the oxygen concentration is 18 vol. % or less is preferable. Also, the oxygen scavenger is not particularly limited, but from the perspective of not causing chemical reactions with the GaN substrate surfaces, active iron oxide, activated carbon, or the like is preferable.

Furthermore, examples of a technique for reducing, in an atmosphere for storing the GaN substrate, the water-vapor concentration to no more than 25 g/m$^3$ include a technique (referred to as "Technique B-1"—likewise below) whereby, referring to FIG. 1, with GaN substrates 1 placed inside the storing device 10, Gas 22 whose water-vapor concentration is 25 g/m$^3$ or less is introduced into the storing device 10, and Gas 42 whose water-vapor concentration is higher than 25 g/m$^3$ is exhausted from the storing device 10, and also include a technique (referred to as "Technique B-2"—likewise below) whereby together with the GaN substrates 1, a dehydrating agent 32 is placed inside the storing device 10. In addition, Technique B-1 and Technique B-2 can be employed in tandem.

Herein, the gas water-vapor concentration is 25 g/m$^3$ or less is not particularly limited, but from the perspective of not causing chemical reactions with the surface of the GaN substrates, a nitrogen gas, argon gas, or other inert gas in which the concentration of water vapor as impurities is 1 vol. % or less is preferable. Also, the dehydrating agent is not particularly limited, but from the perspective of not causing chemical reactions with the GaN substrate surfaces, silica gel activated carbon, or the like is preferable.

Moreover, examples of a technique for having, in the atmosphere for storing GaN substrates, the oxygen concentration be 18 vol. % or less, and the water-vapor concentration be 25 g/m$^3$ or less include a technique ("Technique C-1") whereby with the GaN substrates 1 placed inside the storing device 10, Gas 23 whose oxygen concentration is 18 vol. % and whose water-vapor concentration is 25 g/m$^3$ or less is introduced into the storing device 10, and Gas 43 whose oxygen concentration is higher than 18 vol. % of oxygen and whose water-vapor concentration is higher than 25 g/m$^3$ is exhausted from the storing device 10. Another such example is a technique ("Technique C-2") whereby together with the GaN substrates 1, an oxygen scavenger 31 and a dehydrating agent 32 are placed inside the storing device 10. What is more, Technique C-1 and Technique C-2 can be employed in tandem.

Herein, the gas whose oxygen concentration is 18 vol. % or less and whose water-vapor concentration is 25 g/m$^3$ or less is not particularly limited, but from the perspective of not causing chemical reactions with the surface of the GaN substrates, a nitrogen gas, argon gas, or other inert gas in which the oxygen concentration is 18 vol. % or less and whose water-vapor concentration is 25 g/m$^3$ or less is preferable.

Additionally, the measuring of the oxygen concentration is not particularly limited, but may be carried out by means of a galvanic oxygen analyzer. Also, the measuring of the water-vapor concentration is not particularly limited, but may be carried out by means of a dielectric aquameter or a Karl Fischer moisture analyzer.

Moreover, the temperature of the atmosphere in which GaN substrates are stored is not particularly limited, but from the perspective of not causing chemical reactions with the surface of the GaN substrates, temperatures not more than 60° C. are preferable, with not greater than 40° C. being more preferable. In addition, from the perspective of preventing condensation, temperatures of 5° C. or more are preferable, with at least 10° C. being more preferable.

Furthermore, as for GaN substrates stored by the storing method of Embodiment Mode 1, from the perspective of keeping reaction of the oxygen and/or water vapor inside the storing device with the GaN substrate surfaces under control, and of reducing the adsorption of oxygen and/or water vapor into the GaN substrate surfaces, the surface roughness Ra of the first principal face is preferably 20 nm or less, and the surface roughness Ra of the second principal face is preferably 20 μm or less. From such a perspective, it is more preferable that the surface roughness Ra of the first principal face be 5 nm, and that the surface roughness Ra of the second principal face be 10 μm. Although the relationship between the surface roughness Ra of the GaN substrate principal faces (meaning both the first principal face and the second principal face—likewise hereinafter) and the reactivity and adsorptivity of oxygen and/or water vapor with the GaN substrate principal faces is unclear, the reduction in surface area from lessening the surface roughness Ra is believed to be relevant as one causative factor. Herein, the "first principal face" means the principal face on which semiconductor layers are grown epitaxially, and the "second principal face" means the principal face on the side opposite from the first principal face. Furthermore, "surface roughness Ra" signifies a value in which a predetermined reference surface area is chosen from the topographic surface along its average plane, and the absolute values of the deviation from the average plane of the chosen portion to the profiling surface are summed and the total is averaged in the reference surface area. This surface roughness Ra can be measured employing a non-contact interferometer or 3D-SEM (three-dimensional scanning electron micrometer).

Further in respect of GaN substrates stored by the storing method of Embodiment Mode 1, from the perspective of keeping reaction of the oxygen and/or water vapor inside the storing device with the GaN substrate surfaces under control, and of reducing the adsorption of oxygen and/or water vapor into the GaN substrate surfaces, the off-axis angle formed by the GaN substrate principal faces and the (0001) plane preferably is between 0.05° and 2°, inclusive, in the <1$\bar{1}$00> direction, and is between 0° and 1°, inclusive, in the <11$\bar{2}$0> direction. From such a perspective, it is more preferable that the off-axis angle be between 0.1° and 0.8°, inclusive, in the <1$\bar{1}$00> direction, and between 0° and 0.6°, inclusive, in the <11$\bar{2}$0> direction. Although the relationship between the off-axis angle formed by the GaN substrate principal faces and the (0001) plane and the reactivity and adsorptivity of oxygen and/or water vapor with the GaN substrate principal faces is unclear, the variation, due to there being a misorientation, in the number of sites in the GaN substrate principal faces where combining with oxygen and/or water vapor is possible is believed to be relevant as one causative factor. The off-axis angle formed by the GaN substrate principal faces and the (0001) plane can be measured by XRD (X-ray diffraction).

It will be appreciated that, in Embodiment Mode 1, referring to FIG. 1, with the storing conditions (for example, that the oxygen concentration be 18 vol. % or less and/or the water-vapor concentration be 25 g/m³ or less) in the present invention being imposed on the atmosphere inside the storing device 1 in which the GaN substrates 1 are housed, the GaN substrates 1 can be stored by sealing the GaN substrates 1 into a (not-illustrated) storage container (e.g., a sack such as an aluminum pouch) that shuts out oxygen and water vapor. Further, GaN substrates hermetically sealed in a storage container can be taken out of the storing device 1 and stored.

Embodiment Mode 2

Figure 2:
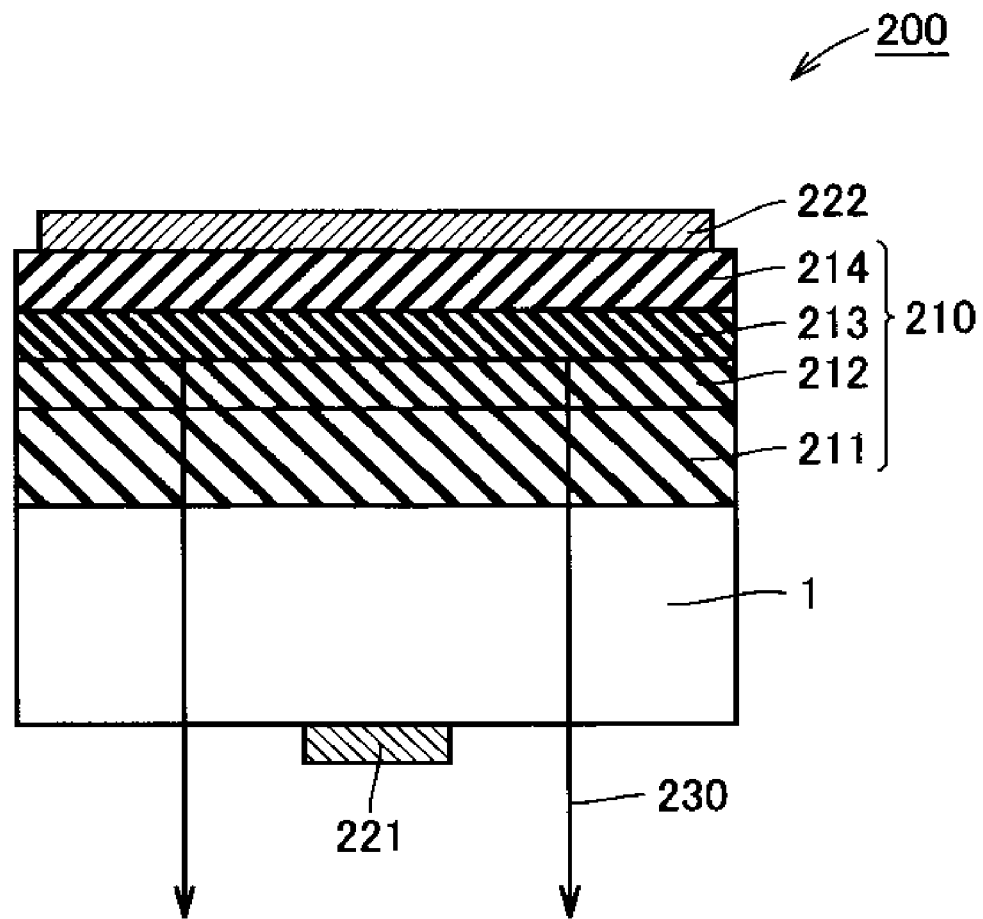
FIG. 2 is a schematic section diagram representing one embodiment of a semiconductor device manufacturing method involving the present invention.

As illustrated in FIG. 2, in a semiconductor device in accordance with the preset invention, an at least single-lamina semiconductor layer 210 is formed on the first principal face of a GaN substrate stored by the storing method of Embodiment Mode 1. Additionally, a semiconductor device manufacturing method in accordance with the present invention includes a step of choosing an GaN substrate stored by the storing method of Embodiment Mode 1 as a base on which to grow the at least single-lamina semiconductor layer 210 on the GaN substrate 1.

GaN substrates stored by the storing method of Embodiment Mode 1 are prevented from being superficially oxidized, whereby semiconductor devices of favorable properties are achieved by growing the at least single-lamina semiconductor layer 210 on the GaN substrates.

There are no particular limitations on the semiconductor layers grown onto the GaN substrates, but in view of the fact that the crystal lattices are highly coordinate, $Al_xGa_yIn_{1-x-y}N$ ($0 \leq x$, $0 \leq y$, $x+y \leq 1$) and other Group III nitride layers are preferable. Also, there are no particular limitations on the technique for growing the semiconductor layer, but from the perspective of ease of growing the semiconductor layer epitaxially onto the GaN substrate, it is preferable to employ a technique such as hydride vapor phase epitaxy (HVPE), metal-organic chemical vapor deposition (MOCVD), or molecular beam epitaxy (MBE).

More specifically, as illustrated in FIG. 2, in a semiconductor device 200 of this embodiment mode, an n-type GaN lamina 211, an $In_{0.2}Ga_{0.8}N$ lamina 212, an $Al_{0.2}Ga_{0.8}N$ lamina 213, and a p-type GaN lamina 214 are successively formed as the semiconductor layer 210 on the GaN substrate 1, and additionally a n-side electrode 221 is formed on the bottom side of the GaN substrate 1 (the face on which the semiconductor layer 210 is not formed), and a p-side electrode 222 is formed on the top side of the p-GaN layer 214, wherein light 230 is emitted.

Embodiments

More specific explanation of a GaN substrate storing method in accordance with the present invention, and of a semiconductor device, including the step of choosing a GaN substrate stored by this storing method to grow an at least single-lamina semiconductor layer on the GaN substrate, will be made, based on the following embodiments and comparative examples.

Comparative Example 1

As illustrated in FIG. 1, GaN substrates 1, grown by HVPE, 400 μm thick and 50.8 mm in diameter, having first principal faces whose surface roughness Ra is 33 nm and second principal faces whose surface roughness is 32.1 μm, and whose principal faces and the (0001) plane form an off-axis angle of 2.5° in the <1$\bar{1}$00> direction and 1.2° in the <11$\bar{2}$0> direction were housed in the storing device 10, and a nitrogen-oxygen gas mixture having an oxygen concentration of 20 vol. % and a water-vapor concentration of 30 g/m³ was introduced through the gas introduction line 20 and gas introducing valve 29 into the storing device 10, and gas with higher oxygen and water-vapor concentrations was exhausted through the gas exhaust line 40 and gas exhaust valve 49 from the storing device 10, to bring the oxygen concentration to 20 vol. % and the water-vapor concentration to 30 g/m³ in the atmosphere inside the storing device 10. In the storing device 10, the GaN substrates were put into a wafer tray (not illustrated), and then sealed, together with the wafer tray, into an aluminum pouch (not illustrated) and then stored at 35° C. for six months.

Next, as illustrated in FIG. 2, a 5-μm thick n-GaN lamina 211, a 3-nm thick $In_{0.2}Ga_{0.8}N$ lamina 212, a 60-nm thick $Al_{0.2}Ga_{0.8}N$ lamina 213, and a 150-nm thick p-GaN lamina 214 were successively grown, as the semiconductor layer 210, by MOCVD onto the GaN substrates 1 having been stored for six months under the foregoing conditions. Subsequently, a 100-nm thick p electrode 222 was formed on the top side of the p-GaN layer 24, and then in the center of the bottom side of the GaN substrates (the face on which the semiconductor layer 210 was not formed), an 100-nm thick× 80-μm diameter n electrode 221 was formed, and the substrates were diced into chips 500 μm×500 μm in size to yield LEDs as the semiconductor devices 200. The emission intensity of the LEDs of Comparative Example 1 at 450 nm peak wavelength were measured by means of a spectral photometer, and letting the average emission intensity of 10 of the LEDs be 1, the relative emission intensities of LEDs of the following Comparative Example 2 and Embodiments 1 through 9 were found. The results are set forth in the table.

Comparative Example 2

As illustrated in FIG. 1, GaN substrates 1 grown by HVPE, 400 μm thick and 50.8 mm in diameter, having a first principal face whose surface roughness Ra is 17 nm and a second principal face whose surface roughness Ra is 15 μm, and whose principal faces and the (0001) plane form an off-axis angle of 1.1° in <1$\bar{1}$00> direction and that of 0.8° in <11$\bar{2}$0> direction were housed in the storing device 10, and then a nitride-oxygen gas mixture with oxygen concentration of 20 vol. % and water-vapor concentration of 30 g/m³ was introduced through the gas introduction line 20 and gas introduction valve 29 into the storing device 10, and gas with higher oxygen and water-vapor concentrations was exhausted through the gas exhaust line 40 and gas exhaust valve 49 from the storing device 10, to bring the oxygen and water-vapor concentrations in the atmosphere inside the storing device 10 to 20 vol. % and 30 g/m³, respectively. The GaN substrate were put in a wafer tray (not illustrated) inside the storing device 10, and sealed, together with the wafer tray, into an aluminum pouch (not illustrated) and then stored at 35° C. for six months. After that, LEDs as semiconductor device were created in the same way as in Comparative Example 1. The relative emission intensity of the LEDs thus produced was 1.01 as against the relative emission intensity of 1.0 of the Comparative Example 1 LEDs. The results are set forth in the table.

Embodiment 1

Apart from introducing a nitride-oxygen gas mixture having an oxygen concentration of 18 vol. % and water-vapor concentration of 25 g/m³ into the storing device 10 to bring the oxygen and water-vapor concentrations in the atmosphere inside the storing device respectively to 18 vol. % and 25 g/m³, GaN substrates having the same surface roughness Ra and the same off-axis angle as those of Comparative Example 1 were stored, and LEDs as semiconductor device were fabricated, in the same manner as in Comparative Example 1. The relative emission intensity of the LEDs thus produced was 1.05 as against the relative emission intensity of 1.0 of the Comparative Example 1 LEDs. The results are set forth in the table.

Embodiment 2

Apart from the GaN substrates to be stored having a first principal face whose surface roughness Ra is 17 nm and a second principal face whose surface roughness Ra is 15 μm, and apart from the off-axis angle formed by the principal faces and the (0001) plane being 2.5° in the <1$\bar{1}$00> direction and 1.2° in the <11$\bar{2}$0> direction, GaN substrates were stored, and LEDs as semiconductor devices were fabricated, under the same conditions as in Embodiment 1. The relative emission intensity of the LEDs thus produced was 1.05 as against the relative emission intensity of 1.0 of the Comparative Example 1 LEDs. The results are set forth in the table.

Embodiment 3

Apart from the GaN substrates to be stored having a first principal face whose surface roughness Ra is 33 nm, and a second principal face whose surface roughness is 32.1 μm, and apart from the off-axis angle formed the principal faces and the (0001) plane being 1.1° in the <1$\bar{1}$00> direction and 0.8° in the <11$\bar{2}$0> direction, the GaN substrates were stored, and LEDs as semiconductor devices were fabricated, under the same conditions in Embodiment 1. The relative emission intensity of the LEDs thus produced was 1.12 as against the relative emission intensity of 1.0 of the Comparative Example 1 LEDs. The results are set forth in the table.

Embodiment 4

Apart from the first principal faces of the GaN substrates having a surface roughness Ra of 17 nm, and the second principal faces having a surface roughness of 15 μm, and the principal faces and the (0001) plane forming an off-axis angle of 1.1° in the <1$\bar{1}$00> direction and 0.8° in the <11$\bar{2}$0> direction, and apart from a nitrogen-oxygen gas mixture having an oxygen concentration of 3 vol. % and a water-vapor concentration of 12 g/m³ being introduced into the storing device to bring the oxygen concentration to 3 vol. % and the water-vapor concentration to 12 g/m³ in the atmosphere inside the storing device, GaN substrates were stored, and LEDs as semiconductor devices were fabricated, in the same manner as in Comparative Example 1. The relative emission intensity of the LEDs thus produced was 1.15 as against the relative emission intensity of 1.0 of the Comparative Example 1 LEDs. The results are set forth in the table.

Embodiment 5

Apart from the first principal faces of the GaN substrates having a surface roughness Ra of 2 nm, and the second principal faces having a surface roughness Ra of 2.4 μm, and the principal faces and the (0001) plane forming an off-axis angle of 0.5° in the <1$\bar{1}$00> direction and 0.2° in the <11$\bar{2}$0> direction, and apart from a nitride-oxygen gas mixture having an oxygen concentration of 0.6 vol. % and a water-vapor concentration of 1 g/m³ being introduced into the storing device to bring the oxygen concentration to 0.6 vol. % and the water-vapor concentration to 1 g/m³ in the atmosphere inside the storing device, GaN substrates were stored, and LEDs as semiconductor devices were fabricated, in the same manner as in Comparative Example 1. The relative emission intensity of the LEDs thus produced was 1.19 as against the relative emission intensity of 1.0 of the Comparative Example 1 LEDs. The results are set forth in the table.

Embodiment 6

Apart from the first principal faces of the GaN substrates having a surface roughness Ra of 2 nm, and the second principal faces having surface roughness Ra of 2.4 μm, and the principal faces and the (0001) plane forming an off-axis angle of 0.5° in the <1$\bar{1}$00> direction and 0.2° in the <11$\bar{2}$0> direction, and apart from an nitride-oxygen gas mixture having an oxygen concentration of 0.6 vol. % and a water-vapor concentration of 30 g/m³ being introduced into the storing device to bring the oxygen concentration to 0.6 vol. % and the water-vapor concentration to 30 g/m³ in the atmosphere inside the storing device, GaN substrates were stored, and LEDs as semiconductor devices were fabricated, in the same manner as in Compared Example 1. The relative emission intensity of the LEDs thus produced was 1.09 as against the relative emission intensity of 1.0 of the Comparative Example 1 LEDs. The results are set forth in the table.

Embodiment 7

Apart from the first principal faces of the GaN substrates having a surface roughness Ra of 2 nm, and the second principal faces having a surface roughness Ra of 2.4 μm, and the principal faces and the (0001) plane forming an off-axis angle of 0.5° in the <1$\bar{1}$00> direction and 0.2° in the <11$\bar{2}$0> direction, and apart from a nitride-oxygen gas mixture having an oxygen concentration of 20 vol. % and a water-vapor concentration of 1 g/m³ being introduced into the storing device to bring the oxygen concentration to 20 vol. % and the water-vapor concentration to 1 g/m³ in the atmosphere inside the storing device, GaN substrates were stored, and LEDs as semiconductor devices were fabricated, in the same manner as in Comparative Example 1. The relative emission intensity of the LEDs thus produced was 1.12 as against the relative emission intensity of 1.0 of the Comparative Example 1 LEDs. The results are set forth in the table.

Embodiment 8

Apart from the first principal faces of the GaN substrates having a surface roughness Ra of 2 nm, and the second principal faces having a surface roughness Ra of 2.4 μm, and the principal faces and the (0001) plane forming an off-axis angle of 0.1° in the <1$\bar{1}$00> direction and 0.05° in the <11$\bar{2}$0> direction, and apart from a nitride-oxygen gas mixture having an oxygen concentration of 0.6 vol. % and a water-vapor concentration of 1 g/m³ being introduced into the storing device to bring the oxygen concentration to 0.6 vol. % and the water-vapor concentration to 1 g/m³ in the atmosphere inside the storing device, GaN substrates were stored, and LEDs as semiconductor devices were fabricated, in the same manner as in Comparative Example 1. The relative emission intensity of the LEDs thus produced was 1.19 as against the relative emission intensity of 1.0 of the Comparative Example 1 LEDs. The results are set forth in the table.

Embodiment 9

Apart from the first principal faces of the GaN substrates having a surface roughness Ra of 2 nm, and the second principal faces having a surface roughness Ra of 2.4 µm, and the principal faces and the (0001) plane forming an off-axis angle of 0.7° in the <1$\bar{1}$00> direction and 0.6° in the <11$\bar{2}$0> direction, and apart from a nitride-oxygen gas mixture having an oxygen concentration of 0.6 vol. % and a water-vapor concentration of 1 g/m$^3$ being introduced into the storing device to bring the oxygen concentration to 0.6 vol. % and the water-vapor concentration to 1 g/m$^3$ in the atmosphere inside the storing device, GaN substrates were stored, and LEDs as semiconductor devices were fabricated, in the same manner as in Comparative Example 1. The relative emission intensity of the LEDs thus produced was 1.19 as against the relative emission intensity of 1.0 of the Comparative Example 1 LEDs. The results are set forth in the table.

term, it has been verified that the same advantages are achieved if the storing term is under 6 months or exceeds 6 months.

The presently disclosed embodiments and implementation examples should in all respects be considered to be illustrative and not limiting. The scope of the present invention is set forth not by the foregoing description but by the scope of the patent claims, and is intended to include meanings equivalent to the scope of the patent claims and all modifications within the scope.

What is claimed is:

1. A GaN-substrate storage system comprising:
    a storage container internally establishing a sealed atmosphere containing either nitrogen gas or argon gas and

TABLE

| | | | Comp. Ex. 1 | Comp. Ex. 2 | Emb. 1 | Emb. 2 | Emb. 3 | Emb. 4 | Emb. 5 | Emb. 6 | Emb. 7 | Emb. 8 | Emb. 9 |
|---|---|---|---|---|---|---|---|---|---|---|---|---|---|
| Substrate storing conditions | Oxygen conc. (vol. %) | | 20 | 20 | 18 | 18 | 18 | 3 | 0.6 | 0.6 | 20 | 0.6 | 0.6 |
| | Water-vapor conc. (g/m$^3$) | | 30 | 30 | 25 | 25 | 25 | 12 | 1 | 30 | 1 | 1 | 1 |
| Substrate principal face properties | Surface roughness Ra | 1$^{st}$ princ. face (nm) | 33 | 17 | 33 | 17 | 33 | 17 | 2 | 2 | 2 | 2 | 2 |
| | | 2$^{nd}$ princ. face (µm) | 32.1 | 15 | 32.1 | 15 | 32.1 | 15 | 2.4 | 2.4 | 2.4 | 2.4 | 2.4 |
| | Off-axis angle | <1$\bar{1}$00> direct. (°) | 2.5 | 1.1 | 2.5 | 2.5 | 1.1 | 1.1 | 0.5 | 0.5 | 0.5 | 0.1 | 0.7 |
| | | <11$\bar{2}$0> direct. (°) | 1.2 | 0.8 | 1.2 | 1.2 | 0.8 | 0.8 | 0.2 | 0.2 | 0.2 | 0.05 | 0.6 |
| LED rel. intensity | | | 1 | 1.01 | 1.05 | 1.05 | 1.12 | 1.15 | 1.19 | 1.09 | 1.12 | 1.19 | 1.19 |

Figure 3:
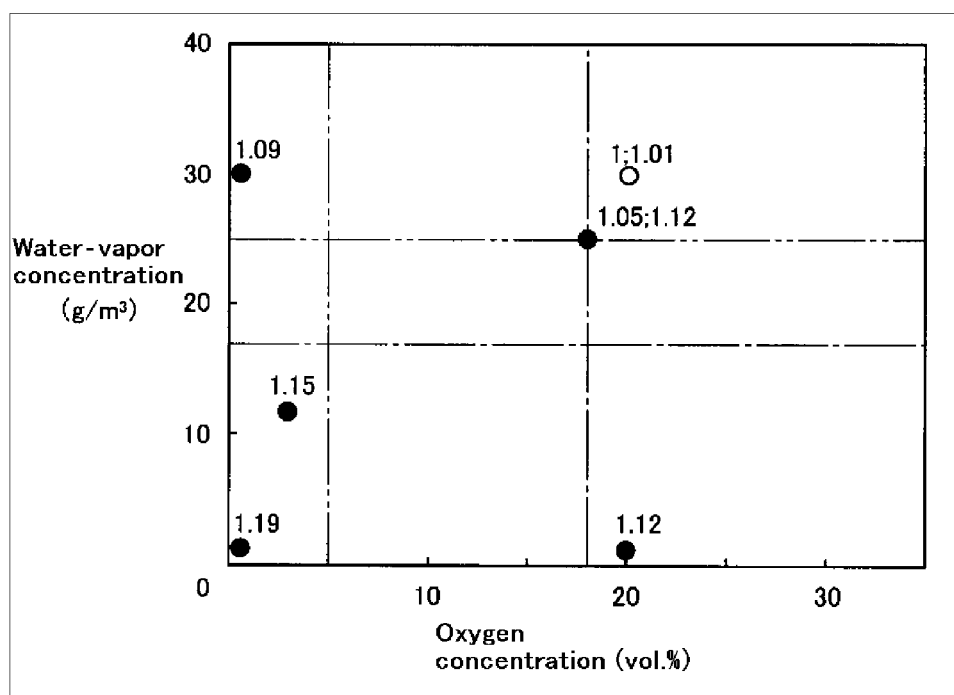
FIG. 3 is a chart diagramming the relationship between oxygen and water-vapor concentrations in an atmosphere for storing GaN substrates, and semiconductor device properties.

The results in the table are summarized in FIG. 3. FIG. 3 is a plot of Comparative Examples 1 and 2 (white circles) and Embodiments 1 through 9 (black circles) within coordinates in which the horizontal axis represents the oxygen concentration (vol. %) and the vertical axis represents the water-vapor concentration (g/m$^3$). The numerical values at each point express the relative emission intensity of whichever of the LEDs of Comparative Example 1 and 2, and Embodiments 1 through 9.

As is clear from Comparative Examples 1, 2 and Embodiments 1 though 9 in the table and FIG. 3, semiconductor devices in which an at least single-lamina semiconductor layer is formed on a GaN substrate stored in an atmosphere in which an oxygen concentration is 18 vol. % or less and/or a water-vapor concentration is 25 g/m$^3$ or less exhibit improved properties, compared with those in which the at least single-lamina semiconductor layer is formed on a GaN substrate stored in an atmosphere in which an oxygen concentration is more than 18 vol. % and a water-vapor concentration is more than 25 g/m$^3$. In addition, as is clear from Embodiments 4 through 9, bringing the oxygen concentration to not more than 5 vol. % and the water-vapor concentration to not more than 17 g/m$^3$ in the atmosphere for storing the GaN substrates improves the semiconductor device properties. Also, having the surface roughness Ra of the GaN substrates' first principal face be 20 nm or less, and the surface roughness Ra of the GaN substrates' second principal face be 20 µm less, as well as having the off-axis angle formed by the GaN substrates' principal faces and the (0001) plane be between 0.05° and 2°, inclusive in the <1$\bar{1}$00> direction and between 0° and 1°, inclusive, in the <11$\bar{2}$0> direction improves the semiconductor device properties.

Although in the foregoing embodiments and comparative examples the GaN substrate is stored for 6 months as storing being hermetic to oxygen and water vapor, said storage-container atmosphere therein for sealing a plurality of substrates and having a temperature from 5° C. to 60° C. and having an oxygen concentration of from 0.6 vol. % to 5 vol. % and/or a water-vapor concentration of from 1 g/m$^3$ to 17 g/m$^3$;
    at least one device-formation-ready GaN substrate sealed inside said storage container, said GaN substrate defining first and second principal faces, and the first principal face having a surface roughness Ra of from 2 nm to 20 nm and the second principal face having a surface roughness Ra of from 2.4 µm to 20 µm, wherein an off-axis angle formed by the principal faces on said GaN substrate and its (0001) plane is between 0.05° and 2°, inclusive, in the <1$\bar{1}$00> direction, and between 0° and 1°, inclusive, in the <11$\bar{2}$0> direction; and
    a storing device, storing said storage container, and equipped with a gas-introducing valve and, connected to said gas-introducing valve, an inert-gas introduction line, and equipped with a gas-exhaust valve and, connected to said gas-exhaust valve, a gas-exhaust line, said storing device therein for creating said storage-container atmosphere by enabling, via said gas-introducing valve and said inert-gas introduction line, the introduction into the storing device of an inert gas of from 0.6 vol. % to 5 vol. % oxygen concentration and from 1 g/m$^3$ to 17 g/m$^3$ water-vapor concentration, and by enabling, via said gas-exhaust valve and said gas-exhaust line, the exhaustion from the storing device of gas of more than 5 vol. % oxygen concentration and more than 17 g/m$^3$ water-vapor concentration.

2. A GaN-substrate storage system as set forth in claim 1, wherein said storage container is made of aluminum.

* * * * *